United States Patent
Hoydis et al.

(10) Patent No.: US 12,107,679 B2
(45) Date of Patent: Oct. 1, 2024

(54) ITERATIVE DETECTION IN A COMMUNICATION SYSTEM

(71) Applicant: Nokia Technologies Oy, Espoo (FI)

(72) Inventors: Jakob Hoydis, Paris (FR); Sebastian Cammerer, Tubingen (DE); Sebastian Dorner, Bad Mergentheim (DE); Stephan Ten Brink, Stuttgart (DE)

(73) Assignee: Nokia Technologies Oy, Espoo (FI)

( * ) Notice: Subject to any disclaimer, the term of this patent is extended or adjusted under 35 U.S.C. 154(b) by 412 days.

(21) Appl. No.: 17/594,511

(22) PCT Filed: Apr. 29, 2019

(86) PCT No.: PCT/EP2019/060961
§ 371 (c)(1),
(2) Date: Oct. 20, 2021

(87) PCT Pub. No.: WO2020/221427
PCT Pub. Date: Nov. 5, 2020

(65) Prior Publication Data
US 2022/0209888 A1    Jun. 30, 2022

(51) Int. Cl.
*H04L 1/00*      (2006.01)
*G06N 3/08*     (2023.01)
*H04L 1/1607*  (2023.01)

(52) U.S. Cl.
CPC ............. *H04L 1/005* (2013.01); *G06N 3/08* (2013.01); *H04L 1/1607* (2013.01)

(58) Field of Classification Search
CPC .......... G06N 3/08; H04L 1/1607; H04L 1/005
See application file for complete search history.

(56) References Cited

U.S. PATENT DOCUMENTS 7,551,664 B2    6/2009  Zhang et al. ................. 375/147
2001/0004390 A1  6/2001  Pukkila et al.
(Continued)

FOREIGN PATENT DOCUMENTS

CA    2443414 A1    10/2002
CN    1579077 A     2/2005
(Continued)

OTHER PUBLICATIONS

Zhang You-wen and Shi Shao-qi "Research on the Adaptive Iterative Receiver for IDMA-Based Underwater Acoustic Communication" Ship Science and Technology vol. 38 Supplemental 1. Jul. 31, 2016.
(Continued)

*Primary Examiner* — Basil Ma
(74) *Attorney, Agent, or Firm* — Nokia Technologies Oy

(57) ABSTRACT

An apparatus, computer program and method is described including receiving data at a receiver of a communication system, generating an estimate of the data as transmitted by a transmitter of the transmission system (wherein generating the estimate includes a receiver algorithm having at least some trainable weights), generating a refined estimate of the transmitted data, based on said estimate and an error correction algorithm (wherein, in an operational mode, said estimate of the data as transmitted is generated based on the received data and said refined estimate); and generating, in the operational mode, a revised estimate of the transmitted data on each of a plurality of iterations of said generating an estimate of the transmitted data until a first condition is reached.

15 Claims, 6 Drawing Sheets

(56) References Cited

U.S. PATENT DOCUMENTS

2003/0187928 A1    10/2003  MacLeod et al.
2020/0343997 A1*  10/2020  Radosevic ............ H04L 1/0064
2021/0142158 A1*   5/2021  Agrawal ............ H03M 13/1111

FOREIGN PATENT DOCUMENTS

| CN | 103379056 A | 10/2013 |
| CN | 105406939 A | 3/2016 |
| CN | 108712353 A | 10/2018 |
| EP | 0755141 A2 | 1/1997 |
| FI | 113721 B | 5/2004 |

OTHER PUBLICATIONS

Dangl, M.A. et al., "Convergence behavior of iterative equalization and decoding schemes with memory", Globecom '03, 2003 IEEE Global Telecommunications Conference, abstract only, 1 pg.
Abdulkader, Hasan, et al., "Neural Networks-Based Turbo Equalization of a Satellite Communication Channel", IEEE, Jun. 22, 2014, 5 pgs.

* cited by examiner

ITERATIVE DETECTION IN A COMMUNICATION SYSTEM

CROSS REFERENCE TO RELATED APPLICATION

This patent application is a U.S. National Stage application of International Patent Application Number PCT/EP2019/060961 filed Apr. 29, 2019, which is hereby incorporated by reference in its entirety.

FIELD

The present specification relates to estimating, at a receiver, data as transmitted by a transmitter of a communication system.

BACKGROUND

A simple communication system includes a transmitter, a transmission channel, and a receiver. Although a number of such communication systems are known, there remains a need for further developments in this area. For example, there remains a need for further developments in estimating, at a receiver, data as transmitted by a transmitter of such a communication system.

SUMMARY

In a first aspect, this specification provides an apparatus comprising: means for receiving data at a receiver, the data being transmitted by a transmitter of a communication system comprising the transmitter, a channel and the receiver; means for generating an estimate of the data as transmitted by the transmitter, wherein the means for generating the estimate comprises a receiver algorithm having at least some trainable weights; means for generating a refined estimate of the transmitted data, based on said estimate and an error correction algorithm, wherein, in an operational mode, said means for generating said estimate of the data as transmitted generates said estimate based on the received data and said refined estimate; and means for generating, in the operational mode, a revised estimate of the transmitted data on each of a plurality of iterations of said generating an estimate of the transmitted data until a first condition is reached. The first condition may comprise a defined performance criterion. Alternatively, or in addition, the first condition may comprise a defined number of iterations.

The means for generating an estimate of the transmitted data may generate an initial estimate on a first iteration of said generating an estimate of the transmitted data. Said first iteration may be generated without reference to said refined estimate.

Some examples further comprise means for training the trainable weights of the receiver algorithm in a training mode. The means for training the trainable weights may adjust the trainable weights in order to minimise a loss function, wherein the loss function is based on data being transmitted by the transmitter and a training estimate of the transmitted data (e.g. based on the received data and a feedback term) generated by said means for generating an estimate of the transmitted data. The means for training the trainable weights of the receiver algorithm may comprise: means for initialising said trainable weights; means for obtaining a plurality of data sets, each data set comprising received data and corresponding transmitted data of said communication system; means for generating a feedback term for each of the plurality of data sets (said feedback terms may have a distribution based on an expected distribution of said refined estimate in the operational mode); and means for updating the trainable weights to minimise said loss function, wherein the loss function is based on transmitted data of said data sets and a respective training estimate of the transmitted data generated by said means for generating an estimate of the transmitted data, wherein the training estimate is based on the respective received data and the respective feedback term. Some examples further comprise repeating said updating said trainable weights based on further obtained data sets and generated feedback terms.

In some examples, the receiver algorithm comprises a neural network. Said neural network may have a first input for receiving the data received at the receiver and a second input for receiving a signal based on the refined estimate of the transmitted data. The neural network may generate said estimate of the data as transmitted by the transmitter.

The said means may comprise: at least one processor; and at least one memory including computer program code, the at least one memory and the computer program configured, with the at least one processor, to cause the performance of the apparatus.

In a second aspect, this specification provides an apparatus comprising: means for generating an estimate of data transmitted by transmitter of a communication system, based on data received at a receiver of the communication system, wherein the means for generating the estimate comprises a receiver algorithm having at least some trainable weights; means for initialising said trainable weights; means for obtaining a plurality of data sets, each data set comprising data received at the receiver and corresponding transmitted data of said communication system; means for generating a feedback term for each of the plurality of data sets, wherein said feedback terms have a distribution based on an expected distribution of said refined estimate in an operational mode; and means for updating the trainable weights, in a training mode, to minimise a loss function, wherein the loss function is based on transmitted data of said data sets and a respective training estimate of the transmitted data generated by said means for generating an estimate of the transmitted data, wherein the training estimate is based on the respective received data and the respective feedback term. The said means may comprise: at least one processor; and at least one memory including computer program code, the at least one memory and the computer program configured, with the at least one processor, to cause the performance of the apparatus.

The second aspect may further comprise at least some of the features of the first aspect as described above.

In a third aspect, this specification describes a method comprising: receiving data at a receiver, the data being transmitted by a transmitter of a communication system comprising the transmitter, a channel and the receiver; generating an estimate of the data as transmitted by the transmitter using a receiver algorithm having at least some trainable weights; generating a refined estimate of the transmitted data, based on said estimate and an error correction algorithm, wherein, in an operational mode, said generating said estimate of the data as transmitted generates said estimate based on the received data and said refined estimate; and generating, in the operational mode, a revised estimate of the transmitted data on each of a plurality of iterations of said generating an estimate of the transmitted data until a first condition is reached. The first condition may comprise a defined performance criterion. Alternatively, or in addition, the first condition may comprise a defined number of iterations.

Generating an estimate of the transmitted data may comprise generating an initial estimate on a first iteration of said generating an estimate of the transmitted data. Said first iteration may be generated without reference to said refined estimate.

Some examples further comprise training the trainable weights of the receiver algorithm in a training mode. Training the trainable weights may comprise adjusting the trainable weights in order to minimise a loss function, wherein the loss function is based on data being transmitted by the transmitter and a training estimate of the transmitted data (e.g. based on the received data and a feedback term) generated during the generating of the estimate of the transmitted data. Training the trainable weights of the receiver algorithm may comprise: initialising said trainable weights; obtaining a plurality of data sets, each data set comprising received data and corresponding transmitted data of said communication system; generating a feedback term for each of the plurality of data sets (said feedback terms may have a distribution based on an expected distribution of said refined estimate in the operational mode); and updating the trainable weights to minimise said loss function, wherein the loss function is based on transmitted data of said data sets and a respective training estimate of the transmitted data generated during the generating the estimate of the transmitted data, wherein the training estimate is based on the respective received data and the respective feedback term. Some examples further comprise repeating said updating said trainable weights based on further obtained data sets and generated feedback terms.

In some examples, the receiver algorithm comprises a neural network.

In a fourth aspect, this specification describes a method comprising: generating an estimate of data transmitted by transmitter of a communication system, based on data received at a receiver of the communication system, using a receiver algorithm having at least some trainable weights; initialising said trainable weights; obtaining a plurality of data sets, each data set comprising data received at the receiver and corresponding transmitted data of said communication system; generating a feedback term for each of the plurality of data sets, wherein said feedback terms have a distribution based on an expected distribution of said refined estimate in an operational mode; and updating the trainable weights, in a training mode to minimise a loss function, wherein the loss function is based on transmitted data of said data sets and a respective training estimate of the transmitted data generated by said receiver algorithm, wherein the training estimate is based on the respective received data and the respective feedback term.

The fourth aspect may further comprise at least some of the features of the third aspect as described above.

In a fifth aspect, this specification describes an apparatus configured to perform any method as described with reference to the third or fourth aspects.

In a sixth aspect, this specification describes computer-readable instructions which, when executed by computing apparatus, cause the computing apparatus to perform any method as described with reference to the third or fourth aspects.

In a seventh aspect, this specification describes a computer readable medium comprising program instructions stored thereon for performing at least the following: receiving data at a receiver, the data being transmitted by a transmitter of a communication system comprising the transmitter, a channel and the receiver; generating an estimate of the data as transmitted by the transmitter using a receiver algorithm having at least some trainable weights; generating a refined estimate of the transmitted data, based on said estimate and an error correction algorithm, wherein, in an operational mode, said estimate of the data as transmitted is generated based on the received data and said refined estimate; and generating, in the operational mode, a revised estimate of the transmitted data on each of a plurality of iterations of said generating an estimate of the transmitted data until a first condition is reached.

In an eighth aspect, this specification describes a computer readable medium comprising program instructions stored thereon for performing at least the following: generating an estimate of data transmitted by transmitter of a communication system, based on data received at a receiver of the communication system, using a receiver algorithm having at least some trainable weights; initialising said trainable weights; obtaining a plurality of data sets, each data set comprising data received at the receiver and corresponding transmitted data of said communication system; generating a feedback term for each of the plurality of data sets, wherein said feedback terms have a distribution based on an expected distribution of said refined estimate in an operational mode; and updating the trainable weights, in a training mode, to minimise a loss function, wherein the loss function is based on transmitted data of said data sets and a respective training estimate of the transmitted data generated by said receiver algorithm, wherein the training estimate is based on the respective received data and the respective feedback term.

In a ninth aspect, this specification describes a computer program comprising instructions for causing an apparatus to perform at least the following: receive data at a receiver, the data being transmitted by a transmitter of a communication system comprising the transmitter, a channel and the receiver; generate an estimate of the data as transmitted by the transmitter using a receiver algorithm having at least some trainable weights; generate a refined estimate of the transmitted data, based on said estimate and an error correction algorithm, wherein, in an operational mode, generating said estimate of the data as transmitted generates said estimate based on the received data and said refined estimate; and generate, in the operational mode, a revised estimate of the transmitted data on each of a plurality of iterations of said generating an estimate of the transmitted data until a first condition is reached.

In a tenth aspect, this specification describes a computer program comprising instructions for causing an apparatus to perform at least the following: generate an estimate of data transmitted by transmitter of a communication system, based on data received at a receiver of the communication system, using a receiver algorithm having at least some trainable weights; initialise said trainable weights; obtain a plurality of data sets, each data set comprising data received at the receiver and corresponding transmitted data of said communication system; generate a feedback term for each of the plurality of data sets, wherein said feedback terms have a distribution based on an expected distribution of said refined estimate in an operational mode; and update the trainable weights, in a training mode to minimise a loss function, wherein the loss function is based on transmitted data of said data sets and a respective training estimate of the transmitted data generated by said receiver algorithm, wherein the training estimate is based on the respective received data and the respective feedback term.

In an eleventh aspect, this specification describes an apparatus comprising: at least one processor; and at least one memory including computer program code which, when executed by the at least one processor, causes the apparatus to: receive data at a receiver, the data being transmitted by a transmitter of a communication system comprising the transmitter, a channel and the receiver; generate an estimate of the data as transmitted by the transmitter using a receiver algorithm having at least some trainable weights; generate a refined estimate of the transmitted data, based on said estimate and an error correction algorithm, wherein, in an operational mode, generating said estimate of the data as transmitted generates said estimate based on the received data and said refined estimate; and generate, in the operational mode, a revised estimate of the transmitted data on each of a plurality of iterations of said generating an estimate of the transmitted data until a first condition is reached.

In a twelfth aspect, this specification describes an apparatus comprising: at least one processor; and at least one memory including computer program code which, when executed by the at least one processor, causes the apparatus to: generate an estimate of data transmitted by transmitter of a communication system, based on data received at a receiver of the communication system, using a receiver algorithm having at least some trainable weights; initialise said trainable weights; obtain a plurality of data sets, each data set comprising data received at the receiver and corresponding transmitted data of said communication system; generate a feedback term for each of the plurality of data sets, wherein said feedback terms have a distribution based on an expected distribution of said refined estimate in an operational mode; and update the trainable weights, in a training mode to minimise a loss function, wherein the loss function is based on transmitted data of said data sets and a respective training estimate of the transmitted data generated by said receiver algorithm, wherein the training estimate is based on the respective received data and the respective feedback term.

In a thirteenth aspect, this specification describes an apparatus comprising: a receiver for receiving data, the data being transmitted by a transmitter of a communication system comprising the transmitter, a channel and the receiver, the receiver comprising a receiver algorithm (such as a neural network) for generating an estimate of the data as transmitted by the transmitter, wherein the receiver algorithm comprises at least some trainable weights; and a decoder for generating a refined estimate of the transmitted data, based on said estimate and an error correction algorithm, wherein, in an operational mode, said receiver algorithm generates said estimate based on the received data and said refined estimate, wherein, in the operational mode, a revised estimate of the transmitted data is generated on each of a plurality of iterations of said generating an estimate of the transmitted data until a first condition is reached.

In a fourteenth aspect, this specification describes an apparatus comprising: a receiver module for generating an estimate of data transmitted by transmitter of a communication system, based on data received at a receiver of the communication system, wherein the receiver module comprises a receiver algorithm having at least some trainable weights; an initialisation module for initialising said trainable weights; a control module for obtaining a plurality of data sets, each data set comprising data received at the receiver and corresponding transmitted data of said communication system; a feedback module for generating a feedback term for each of the plurality of data sets, wherein said feedback terms have a distribution based on an expected distribution of said refined estimate in an operational mode; and a training module for updating the trainable weights, in a training mode, to minimise a loss function, wherein the loss function is based on transmitted data of said data sets and a respective training estimate of the transmitted data generated by said receiver module, wherein the training estimate is based on the respective received data and the respective feedback term.

BRIEF DESCRIPTION OF THE DRAWINGS

Example embodiments will now be described, by way of non-limiting examples, with reference to the following schematic drawings, in which.

DETAILED DESCRIPTION

Figure 1:
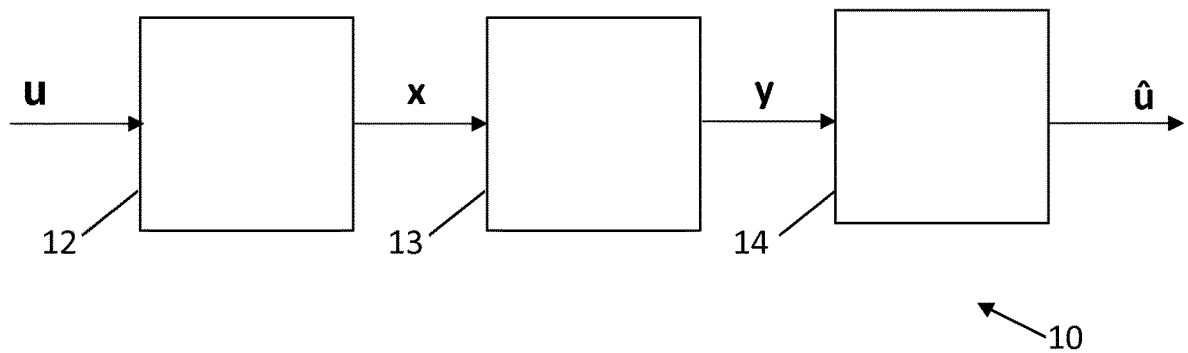
FIG. 1 is a block diagram of a communication system in accordance with an example embodiment.

In the description and drawings, like reference numerals refer to like elements throughout.

FIG. 1 is a block diagram of a communication system, indicated generally by the reference numeral 10, in accordance with an example embodiment;

The system 10 includes a transmitter 12, a channel 13 and a receiver 14. Viewed at a system level, the system 10 converts a vector u of information bits received at the input of the transmitter 12 into an output vector û at the output of the receiver 14.

More specification, the transmitter 12 transforms the vector u into a transmit vector x for transmission over the channel 13. The transmit vector x is transmitted over the channel and received at the receiver 14 as a channel output vector y. The receiver 14 generates the output û, which is an estimate of the originally transmitted information vector u.

As described in detail below, a receiver algorithm implemented by the receiver 14 may be implemented as a differentiable parametric function and may include at least some trainable weights (which may be trainable through stochastic gradient descent). Similarly, a transmitter algorithm implemented by the transmitter 12 may be implemented as a differentiable parametric function and may include at least some trainable weights (which may be trainable through stochastic gradient descent).

Figure 2:
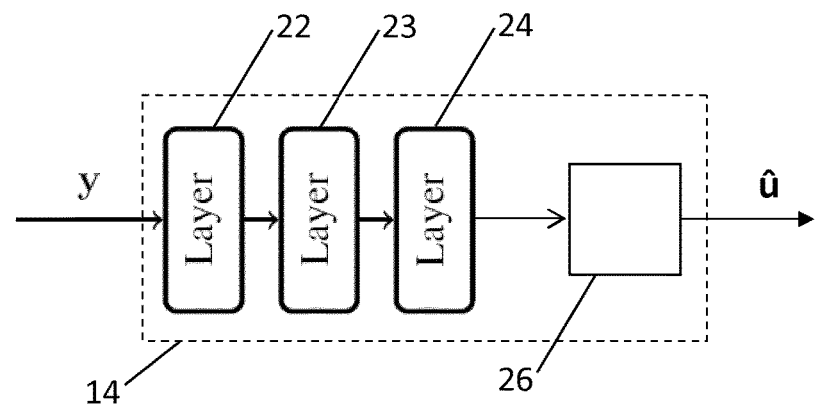
FIG. 2 is a block diagram of an example implementation of a receiver of the communication system of FIG. 1, in accordance with an example embodiment.

FIG. 2 is a block diagram of an example implementation of at least part of the receiver 14 of the system 10. As shown in FIG. 2, the receiver 14 comprises a plurality of layers of a neural network (a first layer 22, a second layer 23 and a third layer 24 are shown by way of example only; more or fewer layers could be provided in an example implementation).

The receiver 14 also comprises an output module 26. The output module 26 may, for example, be provided to convert the output of the final layer 26 of the receiver neural network into the most likely estimate of the relevant transmitted bit or symbol. The output module 26 may, for example, include an arg max module that generates the relevant output.

Thus, the receiver 14 may include a module (such as a neural network) for implementing a receiver algorithm. Similarly, the transmitter 12 may include a module (such as a neural network) for implementing a transmitter algorithm.

In many digital communication systems (such as the system 10), sequences of coded bits are mapped to modulated symbols (e.g. 6 bits may be mapped to one QAM64 symbol) as part of a modulation process. The mapping of bit sequences to symbols may be referred to as bit mapping or bit labelling. One commonly used bit labelling scheme is Gray labelling. In many circumstances, finding an optimal bit labelling arrangement is difficult. This can lead to the use of sub-optimal bit labelling, resulting in a reduced bit error rate (BER) performance.

As described in detail below, example embodiments described herein implement a receiver algorithm with trainable parameters that operates not only on channel outputs, but also on feedback from an outer channel decoder. This enables iterative demapping and decoding leading, for example, to improved bit error rate (BER) performance, in particular for sub-optimal bit labelling.

Figure 3:
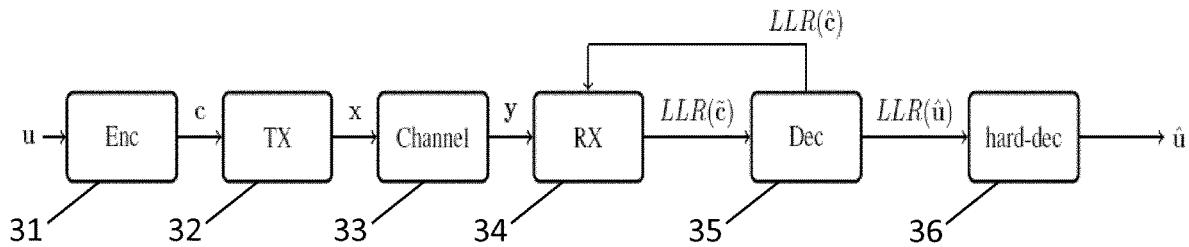
FIG. 3 is a block diagram of a communication system in accordance with an example embodiment.

FIG. 3 is a block diagram of a communication system, indicated generally by the reference numeral 30, in accordance with an example embodiment. The system 30 comprises an encoder 31, a transmitter 32, a channel 33, a receiver 34, a decoder 35 and a hard decoder 36. As described in detail below, the communication system 30 makes use of error correction codes or similar algorithms in the reception of data. Moreover, the receiver has trainable parameters that can be optimised, for example, using the principles of machine learning.

The encoder 31 transforms a vector u of information bits into a vector c of coded bits, i.e. c=Enc(u).

The transmitter 32 transforms the vector c into a transmit vector x, i.e. x=TX(c). Thus, the transmitter 32 may map sequences of coded bits into modulated symbols.

The encoder 31 and transmitter 32 may therefore collectively form the transmitter 12 of the system 10 described above.

The channel 33 (which may form the channel 13 of the system 10) receives input data x and provides an output vector y to the receiver 34. The output vector y is characterised through the conditional probability density function p(y|x).

As described in detail below, the receiver 34 produces a bit-wise estimate LLR(c̃) of the vector c based on the channel output vector y (obtained from the channel 33) and an output of the decoder 35 (as discussed further below). As is known in the art, LLR(x) expresses the log-likelihood ratio of x, whereby:

$$LLR(x) = \log\frac{P(x=0)}{P(x=1)}.$$

The decoder 35 generates a refined estimate (LLR(ĉ)) of c, on the basis of some (de)coding scheme (i.e. LLR(ĉ)=Dec(LLR(c̃))). The decoder 35 also generates an estimate (LLR(û)) of u. Thus, the decoder 35 generates a refined estimate of the vector of coded bits c (and provides that refined estimate to the receiver 34) and generates an estimate of the vector of information bits (and provides that estimate to the hard decoder 36).

The hard decoder 36 provides an estimate of the vector of information bits (û). The hard decoder 36 takes decisions based on the received log-likelihood ratios. For example, if the hard decoder implements the function harddec(LLR(x)), then x=0 if LLR(x)≥0 and x=1 otherwise.

The receiver 34, the decoder 35 and the hard decoder 36 may therefore collectively form the receiver 14 of the system 10.

Figure 4:
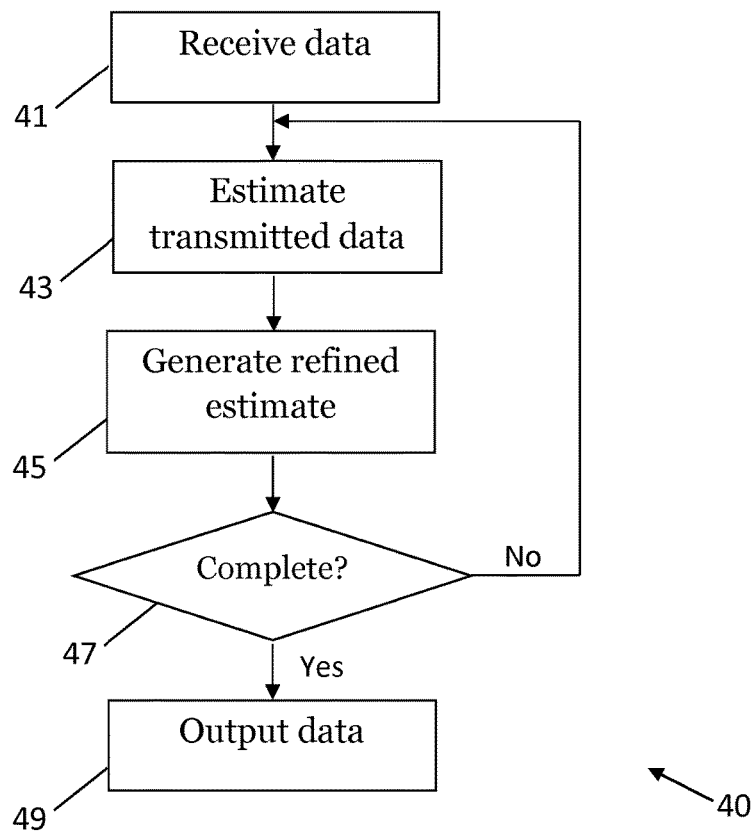
FIG. 4 is a flow chart showing an algorithm in accordance with an example embodiment.

FIG. 4 is a flow chart showing an algorithm, indicated generally by the reference numeral 40, in accordance with an example embodiment. The algorithm shows an example use of the receiver 34, decoder 35 and hard decoder 36 of the system 30 described above.

The algorithm 40 starts at operation 41, where data y is received at the receiver 34, the data being transmitted by a transmitter of a communication system comprising the transmitter 32, the channel 33 and the receiver 34.

At operation 43, an estimate of the data as transmitted by the transmitter is generated. The estimate is generated by a receiver algorithm implemented at the receiver 34 (the receiver 34 having at least some trainable weights). On a first iteration of the operation 43, an initial estimate of the transmitted data is generated at the operation 43. The receiver 34 may, for example, include a number of trainable modules, such as the modules 22, 23 and 24 described above.

At operation 45, a refined estimate of the transmitted data is generated, based on the estimate generated at operation 43 (i.e. the most recent iteration of the operation 43) and an error correction algorithm. The refined estimate is generated by the decoder 35.

At operation 47, it is determined whether the algorithm 40 is complete (dependent, for example, on whether a first condition has been reached, as discussed further below). If not, the algorithm 40 returns to operation 43 (such that a further iteration of the operation 43 is carried out). If the algorithm 40 is deemed to be complete, the algorithm 40 moves to operation 49, as discussed below.

As indicated above, in the first iteration of the operation 43, an initial estimate of the transmitted data is generated. That initial estimate is typically generated without reference to said refined estimate (since it is usually determined before a refined estimate has been generated). In an operational mode (rather than the training mode discussed below), on each further iteration of the operation 43 (i.e. when the algorithm has been deemed not to be complete at an instance of the operation 47), a revised estimate of the transmitted data is generated based on based on the data received in operation 41 and the refined estimate as generated in the previous iteration of operation 45.

Thus, a revised estimate of the transmitted data is generated on each of a plurality of instances of the operation 43 until the first condition is reached.

At operation 49, an output is generated. For example, the decoder 35 may generate an estimate of the (LLR(û)) of the vector u of information bits and the hard decoder 36 may provide an estimate of the vector of information bits û.

As discussed above, the operation 47 may determine whether the algorithm is complete based on whether a first condition has been reached. Example first conditions include a defined performance criterion, a defined number of iterations, or whenever the performance between two iterations does not change by more than a defined amount. The skilled person will be aware of further alternative implementations of said first condition.

The performance of the communication system 30 may be measured using a loss function $L(c, \hat{c})$. The trainable parameters of the receiver (referred to herein as $\theta$) may be chosen such that the average loss is minimised, i.e. such that:

$$\theta^* = \arg\min_{\theta} \mathbb{E}[L(c, RX(y, LLR(\hat{c}); \theta))] \tag{1}$$

Where RX is the receiver algorithm that takes the channel output y and decoder output $\hat{c}$ as inputs, and has trainable parameters $\theta$.

In the equation (1), the expectation is with respect to the inputs u and the channel outputs distributed according to $p(y|x)$. In practice, the above optimisation problem may not be solvable explicitly since $p(y|x)$ may not be known. However, it is typically possible to obtain an approximation $\tilde{\theta}^*$ of $\theta^*$ based on observations, i.e.:

$$\tilde{\theta}^* = \arg\min_{\theta} \frac{1}{N} \sum_{i=1}^{N} L(c_i, RX(y_i, LLR(\hat{c}_i); \theta)) \tag{2}$$

Where:
$c_i$ is the i-th transmitted codeword;
$y_i$ is the resulting observation at the receiver;
$LLR(\hat{c}_i)$ is the decoder's estimate on the i-th transmitted codeword; and
N are the total number of observations.

Figure 5:
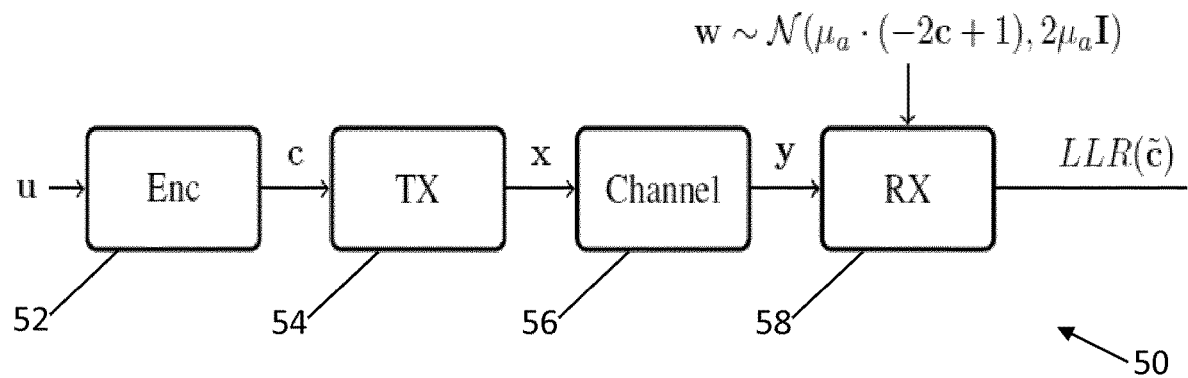
FIG. 5 is a block diagram of a system model in accordance with an example embodiment.

As described above, the receivers 14 and 34 may include a number of trainable parameters. FIG. 5 is a block diagram of a system model, indicated generally by the reference numeral 50, in accordance with an example embodiment. The system model 50 may be used for training the trainable parameters of an example receiver (for example, in a training mode).

The system model 50 comprises an encoder 52, a transmitter 54, a channel 56 and a receiver 58.

The encoder 52 (which is similar to the encoder 31 described above) transforms a vector u of information bits into a vector c of coded bits, i.e. c=Enc(u).

The transmitter 54 (which is similar to the transmitter 32 described above) transforms the vector c into a transmit vector x, i.e. x=TX(c). Thus, the transmitter 32 may map sequences of coded bits into modulated symbols.

The channel 56 (which is similar to the channel 33) receives input data x and provides an output vector y to the receiver 58.

In common with the receiver 34, the receiver model 58 produces a bit-wise estimate $LLR(\tilde{c})$. However, the receiver model 58 receives a feedback term (described in detail below), rather than the output the decoder 35 (since that decoder is not provided in the system model so).

As described further below, the trainable weights of the receiver are trained by adjusting those weights in order to minimise a loss function. That loss function is based on data being transmitted by the transmitter and a training estimate of the transmitted data generated by the receiver model 58. That training estimate is based on the received data and a feedback term.

Figure 6:
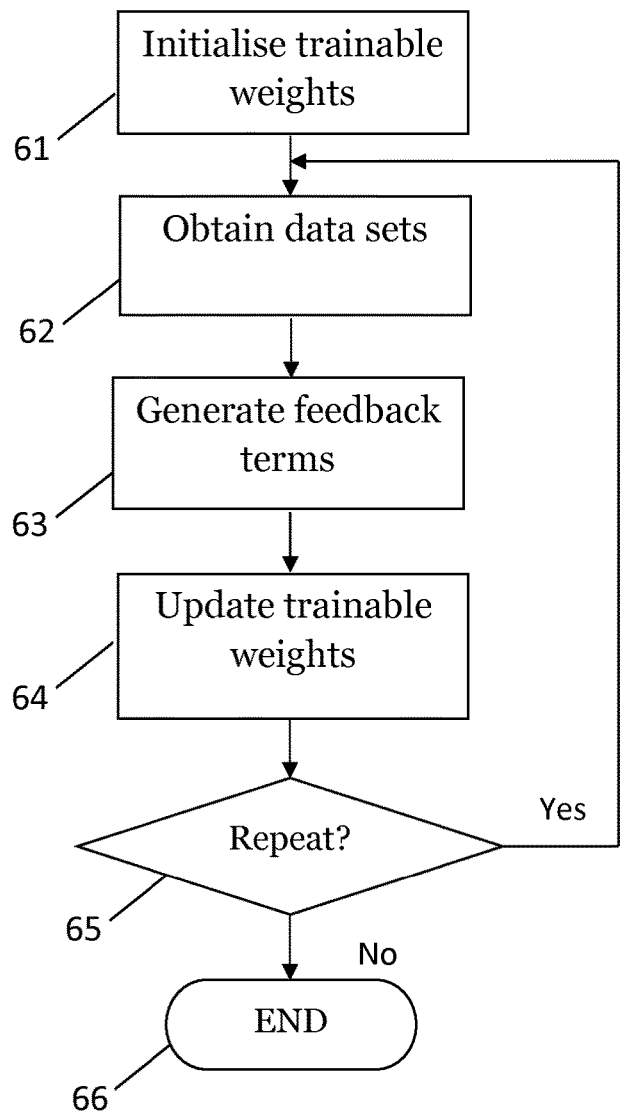
FIGS. 6 and 7 are flow charts showing algorithms in accordance with example embodiments.

FIG. 6 is a flow chart showing an algorithm, indicated generally by the reference numeral 60, in accordance with an example embodiment. The algorithm 60 is described below, by way of example, with reference to the training model 50.

The algorithm 60 starts at operation 61 where trainable weights ($\theta_0$) of the receiver model 58 are initialised. The initialisation may take many forms (such as a random initialisation, or setting the trainable weights to a predetermined start values, such as zero).

At operation 62, a plurality of data sets are obtained, with each data set comprising received data (i.e. outputs y of the channel 56) and corresponding transmitted data (i.e. encoder data c as output by the transmitter). Expressed mathematically, the data sets may include N observations $y_1 \ldots y_N$ and N corresponding transmitted codewords $c_1 \ldots c_N$.

At operation 63, a feedback term is generated for each of the plurality of data sets. The feedback terms may, for example, have a distribution based on an expected distribution of said refined estimate in the operational mode.

Expressed mathematically, the operation 63 involves:
For n=0, ..., K−1, draw N observations of $w_i \sim \mathcal{N}(\mu_a \cdot (-2c_i+1), 2\mu_a I)$ where $\mu_a$ is discussed below.

At operation 64, the trainable weights are updated to minimise a loss function, wherein the loss function is based on transmitted data of said data sets and a respective training estimate of the transmitted data, wherein the training estimate is based on the respective received data and the respective feedback term. At operation 64, the training weights $\theta$ are updated such that $\theta_0 = \theta_K$.

The operation 64 may generate updated parameters ($\theta_{n+1}$) as follows:

$$\theta_{n+1} = \arg\min_{\theta_n} \frac{1}{N} \sum_{i=1}^{N} L(c_i, RX(y_i, w_i; \theta_n))$$

At operation 65, it is determined whether or not to perform a further iteration of updating the trainable weights. If so, the algorithm 60 returns to operation 62 and further data sets and feedback terms are generated (operations 62 and 63) and the training weights updated (operation 64). If not, the algorithm 60 terminates at operation 66.

The operation 65 may be implemented in a number of ways. For example, the training may be repeated until a defined performance criterion is reached, for a defined number of iterations and/or until the performance between two iterations does not change by more than a defined amount.

In the training described above, the value for $\mu_a$ of the feedback term may be a hyperparameter. However, it can be related to the a priori mutual information $I_a$ via the $\mu_a = J^{-1}(I_a)$ function, which interrelates mean and mutual information for a Gaussian random variable mean $\mu_a$ and variance $2\mu_a$ as:

$$I_a = J(\mu_a) \approx (1 - 2^{-H_1 (2\mu_a)^{H_2}})^{H_3}$$

and its inverse:

$$\mu_a = J^{-1}(I_a) \approx \frac{1}{2} \left( -\frac{1}{H_1} \log_2 \left( 1 - I_a^{\frac{1}{H_3}} \right) \right)^{\frac{1}{H_2}}$$

With: $H_1 = 0.3073$, $H_2 = 0.8935$ and $H_3 = 1.1064$.

Alternatively, $I_a$ can be implemented as a random variable during the training. An example choice would be $I_a \sim$ Uniform ([0,1]). Such an arrangement allows the behaviours of the channel decoder to be mimicked relatively easily. Moreover, the Gaussian approximation of the decoder's output is a widely accepted simplification (c.f. the central limit theorem).

Figure 7:
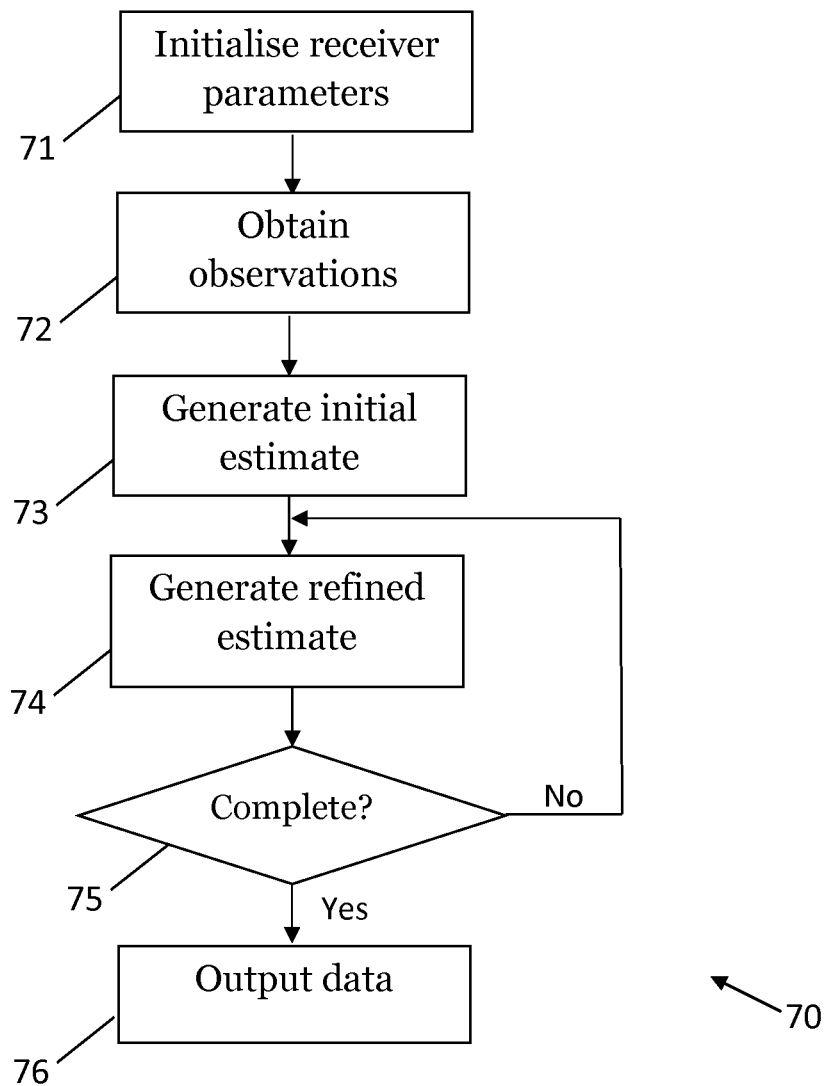

FIG. 7 is a flow chart showing an algorithm, indicated generally by the reference numeral 70, in accordance with an example embodiment. The algorithm 70 shows an example use of a system (such as the system 30) trained using the algorithm 60 described above.

The algorithm 70 starts at operation 71, where receiver parameters are initialised. These parameters may be the parameters of the receiver 34. The parameters may be trainable weights determined by the algorithm 60 described above.

At operation 72, observations of the data obtained at the receiver are obtained. These are the output vectors y referred to above.

On the basis of the obtained observations, the receiver is used, at operation 73, to generate an initial estimate of the transmitted data corresponding to the output vector y. As noted above, in the first iteration, the refined estimate is not used (or is zero), such that: Init LLR($\hat{c}_n$)=0.

A refined estimate is obtained at operation 74 and further refinements are implemented until M iterations are complete, such that:

For n=1, ..., M−1, compute $$LLR(\hat{c}_{n+1}) = Dec(RX(y, LLR(\hat{c}_n); \theta_{opt}))$$

At operation 75, when it is determined that the algorithm is complete, the output data is provided. The output may be harddec(LLR($\hat{c}_M$)).

The number of iterations M may be fixed or may be adjusted dynamically. For example, the iterations may be stopped after a defined number of iterations, whenever the performance between two iterations does not change by more than a defined amount or when the decoder output corresponds to a valid codeword (e.g. which satisfies all parity checks).

Figure 8:
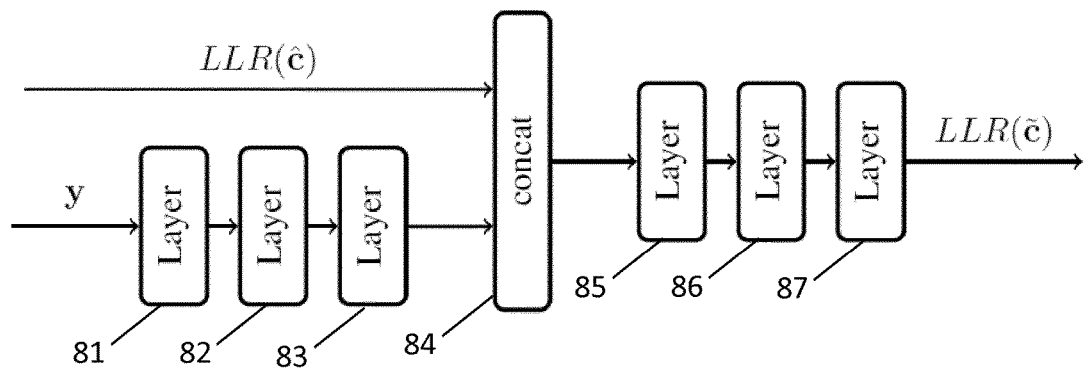
FIG. 8 is a block diagram of a system in accordance with an example embodiment.

FIG. 8 is a block diagram of a system, indicated generally by the reference numeral 80, in accordance with an example embodiment. The system 80 is an example implementation of the receiver 34 (implementing the function RX(y,LLR($\hat{c}$);θ) as a neural network).

The system 80 comprises first to third neural network layers 81 to 83, a concatenation module 84, and fourth to sixth neural network layers 85 to 87.

The system receives the vector y received from the channel 33 and the refined estimate LLR($\hat{c}$) from the decoder 35 of the communication system 30 described above. The vector y is provided to the first layer 81 and processed by the first to third neural network layers. The output of the third layer 83 is concatenated with the refined estimate LLR($\hat{c}$) and the output of the concatenation module 84 provided to the fourth neural network layer 85. The output of the sixth neural network layer 87 provides the output of the system LLR($\tilde{c}$) (i.e. the output of the receiver 34).

Of course, the system 80 is provided by way of example only. Many other configurations will be readily apparent to those skilled in the art.

If the receiver of the communication system is implemented as a neural network, then one output per bit-estimate with a sigmoid activation function may be used to produce bit-wise estimates (instead of the frequently used classification with a softmax activation, which only yields a symbol metric). In such an implementation, the final LLR calculation becomes relatively straightforward.

As described above, in some example embodiments, the receiver of a communication system is represented as a trainable neural network (or some other algorithm having at least some trainable weights) which outputs bit estimates (e.g. hard or soft-valued outputs). The transmitted information may be protected (e.g. through redundancy) by an outer channel code (e.g. a low-density parity check (LDPC) code), or some other error correction arrangement. The receiver algorithm can be provided with both the channel output and the feedback from the outer channel code (e.g. a belief propagation based decoder for LDPC codes) and the receiver may be trained until a desired training performance is achieved. During training, the channel decoder's behaviour can be mimicked (e.g. using a Gaussian distribution). Once trained, the receiver can be used in an iterative manner, together with information from the channel decoder, to provide estimates of the originally transmitted data. In this way, a receiver algorithm can make use of both channel observations and feedback from an outer channel decoder (e.g. error correction codes) in an iterative fashion to provide estimates of transmitted data.

A number of modifications and developments of the principles described above are possible, some of which are outlined below.

The feedback from the outer channel decoder (e.g. the decoder 35 of the system 30) may be extrinsic information (e.g. LLR($\hat{c}$)−LLR($\tilde{c}$)); however, depending on the receiver implementation, this could also be compensated directly in the receiver function or implicitly learned.

In many cases, the optimization over θ cannot be solved exactly. Thus, rather than finding the optical value $\tilde{\theta}^*$, one can simply compute an improved version of θ. Multiple options are possible, some of which are outlined below:

If RX(y;θ) and L( ) are differentiable, gradient descent on the loss function can be used to obtain an update of θ according to:

$$\tilde{\theta}^* = \theta - \eta \nabla_\theta \frac{1}{N} \sum_{i=1}^{N} L(c_i, RX(y_i, LLR(\hat{c}); \theta_i))$$

where η>0 is the learning rate.

When RX, ENC, and DEC are implemented as neural networks, they are generally differentiable.

The channel code (e.g. an LDPC code) can be further optimised to enhance the convergence behaviour.

If the transmitter and receiver can either be jointly trained without a feedback loop, then the receiver may be further trained using the decoder feedback (whilst keeping the transmitter fixed). This may avoid oscillating effects and enable a smooth training behaviour.

Further, methods from reinforcement learning, such as policy gradient, as well as evolutionary methods and other heuristics can be used to compute parameter updates.

In an alternative implementation, one could also iterate over the decoder (if differentiable) and thus avoid using Gaussian approximated messages to mimic the decoder's behaviour.

Figure 9:
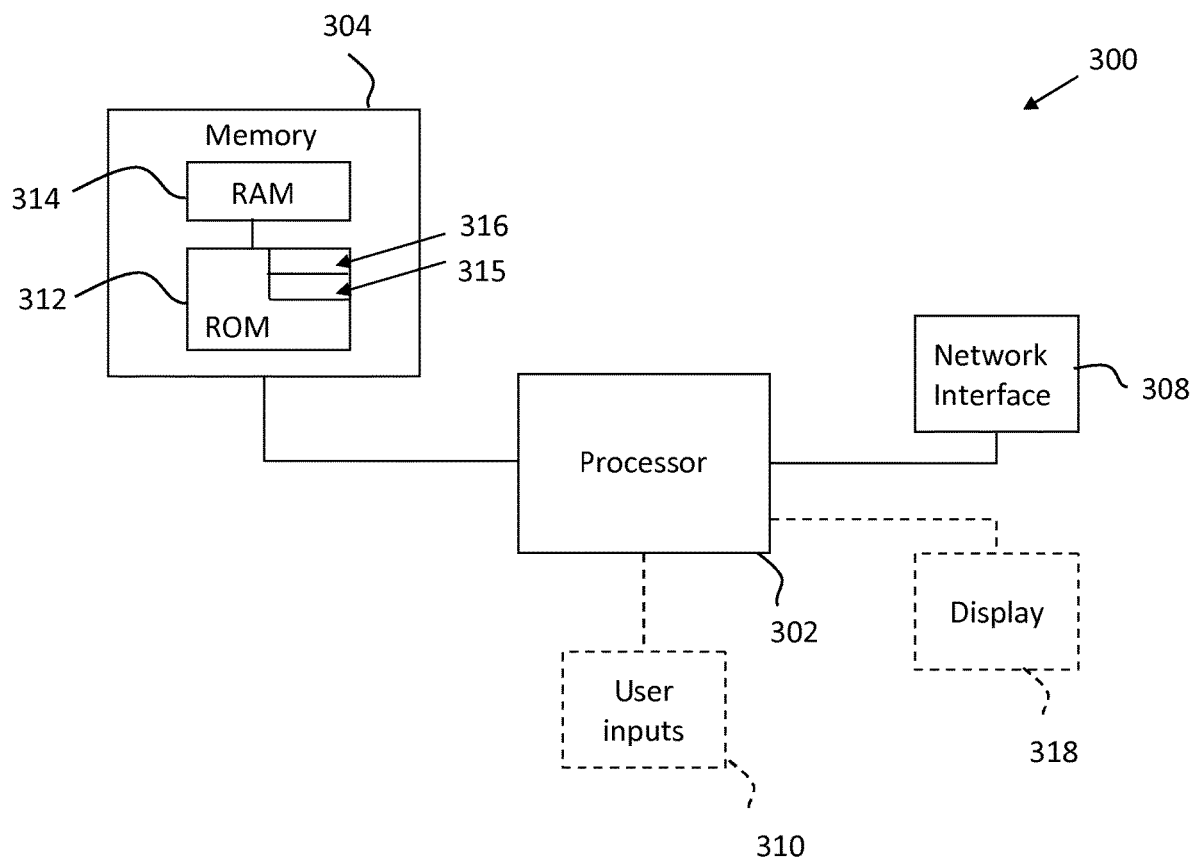
FIG. 9 is a block diagram of a components of a system in accordance with an example embodiment.

For completeness, FIG. 9 is a schematic diagram of components of one or more of the example embodiments described previously, which hereafter are referred to generically as a processing system 300. The processing system 300 may, for example, be the apparatus referred to in the claims below.

The processing system 300 may have a processor 302, a memory 304 closely coupled to the processor and comprised of a RAM 314 and a ROM 312, and, optionally, a user input 310 and a display 318. The processing system 300 may comprise one or more network/apparatus interfaces 308 for connection to a network/apparatus, e.g. a modem which may be wired or wireless. The interface 308 may also operate as a connection to other apparatus such as device/apparatus which is not network side apparatus. Thus, direct connection between devices/apparatus without network participation is possible.

The processor 302 is connected to each of the other components in order to control operation thereof.

The memory 304 may comprise a non-volatile memory, such as a hard disk drive (HDD) or a solid state drive (SSD). The ROM 312 of the memory 304 stores, amongst other things, an operating system 315 and may store software applications 316. The RAM 314 of the memory 304 is used by the processor 302 for the temporary storage of data. The operating system 315 may contain code which, when executed by the processor implements aspects of the algorithms 40, 60 and 70 described above. Note that in the case of small device/apparatus the memory can be most suitable for small size usage i.e. not always a hard disk drive (HDD) or a solid state drive (SSD) is used.

The processor 302 may take any suitable form. For instance, it may be a microcontroller, a plurality of microcontrollers, a processor, or a plurality of processors.

The processing system 300 may be a standalone computer, a server, a console, or a to network thereof. The processing system 300 and needed structural parts may be all inside device/apparatus such as IoT device/apparatus i.e. embedded to very small size In some example embodiments, the processing system 300 may also be associated with external software applications. These may be applications stored on a remote server device/apparatus and may run partly or exclusively on the remote server device/apparatus. These applications may be termed cloud-hosted applications. The processing system 300 may be in communication with the remote server device/apparatus in order to utilize the software application stored there.

Figure 10A:
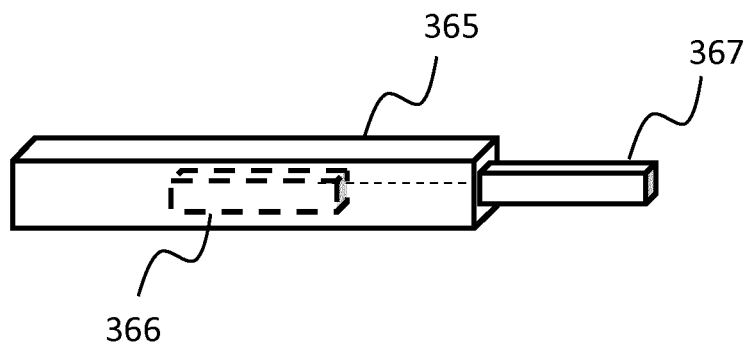
FIGS. 10A and 10B show tangible media, respectively a removable memory unit and a compact disc (CD) storing computer-readable code which when run by a computer perform operations according to embodiments.
Figure 10B:
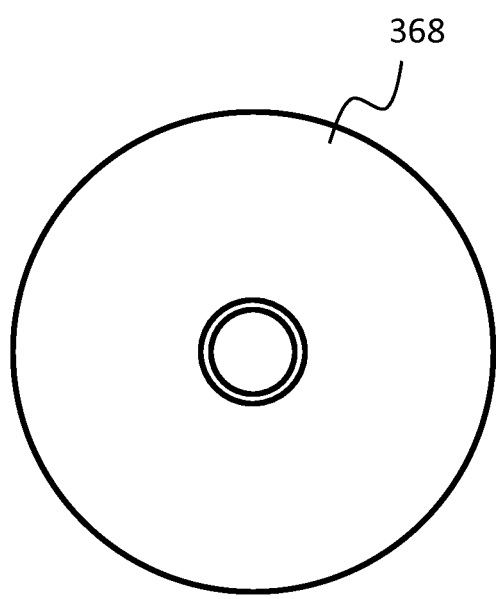

FIGS. 10A and 10B show tangible media, respectively a removable memory unit 365 and a compact disc (CD) 368, storing computer-readable code which when run by a computer may perform methods according to example embodiments described above. The removable memory unit 365 may be a memory stick, e.g. a USB memory stick, having internal memory 366 storing the computer-readable code. The internal memory 366 may be accessed by a computer system via a connector 367. The CD 368 may be a CD-ROM or a DVD or similar. Other forms of tangible storage media may be used. Tangible media can be any device/apparatus capable of storing data/information which data/information can be exchanged between devices/apparatus/network.

Embodiments of the present invention may be implemented in software, hardware, application logic or a combination of software, hardware and application logic. The software, application logic and/or hardware may reside on memory, or any computer media. In an example embodiment, the application logic, software or an instruction set is maintained on any one of various conventional computer-readable media. In the context of this document, a "memory" or "computer-readable medium" may be any non-transitory media or means that can contain, store, communicate, propagate or transport the instructions for use by or in connection with an instruction execution system, apparatus, or device, such as a computer.

Reference to, where relevant, "computer-readable medium", "computer program product", "tangibly embodied computer program" etc., or a "processor" or "processing circuitry" etc. should be understood to encompass not only computers having differing architectures such as single/multi-processor architectures and sequencers/parallel architectures, but also specialised circuits such as field programmable gate arrays FPGA, application specify circuits ASIC, signal processing devices/apparatus and other devices/apparatus. References to computer program, instructions, code etc. should be understood to express software for a programmable processor firmware such as the programmable content of a hardware device/apparatus as instructions for a processor or configured or configuration settings for a fixed function device/apparatus, gate array, programmable logic device/apparatus, etc.

If desired, the different functions discussed herein may be performed in a different order and/or concurrently with each other. Furthermore, if desired, one or more of the above-described functions may be optional or may be combined. Similarly, it will also be appreciated that the flow diagrams of FIGS. 4, 6 and 7 are examples only and that various operations depicted therein may be omitted, reordered and/or combined.

It will be appreciated that the above described example embodiments are purely illustrative and are not limiting on the scope of the invention. Other variations and modifications will be apparent to persons skilled in the art upon reading the present specification.

Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

Although various aspects of the invention are set out in the independent claims, other aspects of the invention comprise other combinations of features from the described example embodiments and/or the dependent claims with the features of the independent claims, and not solely the combinations explicitly set out in the claims.

It is also noted herein that while the above describes various examples, these descriptions should not be viewed in a limiting sense. Rather, there are several variations and modifications which may be made without departing from the scope of the present invention as defined in the appended claims.

The invention claimed is:

1. An apparatus comprising:
   circuitry configured for receiving data at a receiver, the data being transmitted with a transmitter of a communication system comprising the transmitter, a channel and the receiver;
   circuitry configured for generating an estimate of the data as transmitted with the transmitter, wherein the circuitry for generating the estimate comprises a receiver algorithm having at least some trainable weights, wherein the trainable weights of the receiver algorithm have been trained in a training mode by adjusting the trainable weights in order to minimise a loss function, wherein the loss function is based on data being transmitted with the transmitter and a training estimate of the transmitted data generated by the circuitry for generating an estimate of the transmitted data, wherein the training estimate is based on the received data and a feedback term;

circuitry configured for generating a refined estimate of the transmitted data, based on the estimate and an error correction algorithm, wherein, in an operational mode, the circuitry for generating the estimate of the data as transmitted generates the estimate based on the received data and the refined estimate, and wherein the feedback terms have a distribution based on an expected distribution of the refined estimate in the operational mode; and circuitry configured for generating, in the operational mode, a revised estimate of the transmitted data on each of a plurality of iterations of the generating an estimate of the transmitted data until a first condition is reached.

2. The apparatus as claimed in claim 1, wherein the circuitry for generating an estimate of the transmitted data generates an initial estimate on a first iteration of the generating an estimate of the transmitted data.

3. The apparatus as claimed in claim 2, wherein the first initial estimate is generated without reference to the refined estimate.

4. The apparatus as claimed in claim 1, wherein the circuitry for training the trainable weights of the receiver algorithm comprises:

circuitry configured for initialising the trainable weights;
circuitry configured for obtaining a plurality of data sets, each data set comprising received data and corresponding transmitted data of the communication system;
circuitry configured for generating a feedback term for each of the plurality of data sets; and
circuitry configured for updating the trainable weights to minimise the loss function, wherein the loss function is based on transmitted data of the data sets and a respective training estimate of the transmitted data generated with the circuitry for generating an estimate of the transmitted data, wherein the training estimate is based on the respective received data and the respective feedback term.

5. The apparatus as claimed in claim 4, further comprising repeating the updating the trainable weights based on further obtained data sets and generated feedback terms.

6. The apparatus as claimed in claim 1, wherein the first condition comprises a defined performance criterion.

7. The apparatus as claimed in claim 1, wherein the first condition comprises a defined number of iterations.

8. The apparatus as claimed in claim 1, wherein:
the receiver algorithm comprises a neural network;
the neural network has a first input for receiving the data received at the receiver and a second input for receiving a signal based on the refined estimate of the transmitted data; and
the neural network generates the estimate of the data as transmitted with the transmitter.

9. The apparatus as claimed in claim 1, wherein the circuitry comprise:
at least one processor; and
at least one non-transitory memory including computer program code, the at least one memory and the computer program configured, with the at least one processor, to cause the performance of the apparatus.

10. An apparatus comprising:
circuitry configured for generating an estimate of data transmitted with a transmitter of a communication system, based on data received at a receiver of the communication system, wherein the circuitry for generating the estimate comprises a receiver algorithm having at least some trainable weights;
circuitry configured for initialising the trainable weights;
circuitry configured for obtaining a plurality of data sets, each data set comprising data received at the receiver and corresponding transmitted data of the communication system;
circuitry configured for generating a feedback term for each of the plurality of data sets, wherein the feedback terms have a distribution based on an expected distribution of the refined estimate in an operational mode; and
circuitry configured for updating the trainable weights, in a training mode, to minimise a loss function, wherein the loss function is based on transmitted data of the data sets and a respective training estimate of the transmitted data generated with the circuitry for generating an estimate of the transmitted data, wherein the training estimate is based on the respective received data and the respective feedback term.

11. A method comprising:
receiving data at a receiver, the data being transmitted with a transmitter of a communication system comprising the transmitter, a channel and the receiver;
generating an estimate of the data as transmitted with the transmitter using a receiver algorithm having at least some trainable weights, wherein the trainable weights of the receiver algorithm have been trained in a training mode by adjusting the trainable weights in order to minimise a loss function, wherein the loss function is based on data being transmitted with the transmitter and a training estimate of the transmitted data generated by the circuitry for generating an estimate of the transmitted data, wherein the training estimate is based on the received data and a feedback term;
generating a refined estimate of the transmitted data, based on the estimate and an error correction algorithm, wherein, in an operational mode, the generating the estimate of the data as transmitted generates the estimate based on the received data and the refined estimate, and wherein the feedback terms have a distribution based on an expected distribution of the refined estimate in the operational mode; and
generating, in the operational mode, a revised estimate of the transmitted data on each of a plurality of iterations of the generating an estimate of the transmitted data until a first condition is reached.

12. The method as claimed in claim 11, wherein training the trainable weights of the receiver algorithm comprises:
initialising the trainable weights;
obtaining a plurality of data sets, each data set comprising received data and corresponding transmitted data of the communication system;
generating a feedback term for each of the plurality of data sets; and
updating the trainable weights to minimise the loss function, wherein the loss function is based on transmitted data of the data sets and a respective training estimate of the transmitted data generated during generating the estimate of the transmitted data, wherein the training estimate is based on the respective received data and the respective feedback term.

13. A non-transitory computer readable medium comprising program instructions stored thereon for performing the method as claimed in claim 11.

14. A method comprising:
   generating an estimate of data transmitted with a transmitter of a communication system, based on data received at a receiver of the communication system, using a receiver algorithm having at least some trainable weights;
   initialising the trainable weights;
   obtaining a plurality of data sets, each data set comprising data received at the receiver and corresponding transmitted data of the communication system;
   generating a feedback term for each of the plurality of data sets, wherein the feedback terms have a distribution based on an expected distribution of the refined estimate in an operational mode; and
   updating the trainable weights, in a training mode to minimise a loss function, wherein the loss function is based on transmitted data of the data sets and a respective training estimate of the transmitted data generated with the receiver algorithm, wherein the training estimate is based on the respective received data and the respective feedback term.

15. A non-transitory computer readable medium comprising program instructions stored thereon for performing the method as claimed in claim 14.

* * * * *